(12) United States Patent  
Kauerauf et al.

(10) Patent No.: US 9,076,726 B2
(45) Date of Patent: Jul. 7, 2015

(54) METHOD FOR TUNING THE EFFECTIVE WORK FUNCTION OF A GATE STRUCTURE IN A SEMICONDUCTOR DEVICE

(71) Applicant: IMEC, Leuven (BE)

(72) Inventors: Thomas Kauerauf, Leuven (BE); Alessio Spessot, Gradisxa D'isonzo (IT); Christian Caillat, Versonnex (FR)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/132,457

(22) Filed: Dec. 18, 2013

(65) Prior Publication Data

US 2014/0187039 A1  Jul. 3, 2014

(30) Foreign Application Priority Data

Dec. 31, 2012 (EP) ..................................... 12199806
Jan. 18, 2013 (EP) ..................................... 13151958

(51) Int. Cl.

| | |
|---|---|
| *H01L 21/335* | (2006.01) |
| *H01L 21/26* | (2006.01) |
| *H01L 21/28* | (2006.01) |
| *H01L 21/768* | (2006.01) |

(Continued)

(52) U.S. Cl.
CPC .... *H01L 21/28008* (2013.01); *H01L 21/28176* (2013.01); *H01L 21/76838* (2013.01); *H01L 21/268* (2013.01); *H01L 21/823842* (2013.01); *H01L 21/823871* (2013.01); *H01L 2924/0002* (2013.01); *H01L 29/517* (2013.01)

(58) Field of Classification Search
CPC ................. H01L 21/28008; H01L 21/823842; H01L 21/28176

USPC .......................... 438/197, 299, 275, 308, 798
See application file for complete search history.

(56) References Cited

U.S. PATENT DOCUMENTS

| | | | |
|---|---|---|---|
| 6,291,282 B1 * | 9/2001 | Wilk et al. ..................... 438/203 |
| 6,511,575 B1 * | 1/2003 | Kitagawa et al. ............... 355/30 |

(Continued)

FOREIGN PATENT DOCUMENTS

| | | |
|---|---|---|
| EP | 0980091 A2 | 2/2000 |
| EP | 1139409 A2 | 4/2001 |
| WO | 2009/156954 A1 | 12/2009 |

OTHER PUBLICATIONS

European Search Report, European Patent Application No. 13151958.9, dated Apr. 16, 2013.

*Primary Examiner* — Michele Fan
(74) *Attorney, Agent, or Firm* — McDonnell Boehnen Hulbert & Berghoff LLP

(57) ABSTRACT

A method for tuning the effective work function of a gate structure in a semiconductor device is described. The semiconductor device is part of an integrated circuit and the gate structure has a metal layer and a high-k dielectric layer separating the metal layer from an active layer of the semiconductor device. The method includes providing an interconnect structure of the integrated circuit on top of the gate structure, the interconnect structure comprising a layer stack comprising at least a pre-metal dielectric layer comprising a metal filled connecting via connected to the gate structure through the pre-metal dielectric layer, and the interconnect structure having an upper exposed metal portion; and, thereafter, exposing at least a portion of the upper exposed metal portion to a plasma under predetermined exposure conditions, to tune the effective work function of the gate structure.

14 Claims, 11 Drawing Sheets

(51) Int. Cl.
  *H01L 21/268* (2006.01)
  *H01L 21/8238* (2006.01)
  *H01L 29/51* (2006.01)

(56) References Cited

U.S. PATENT DOCUMENTS

| | | | |
|---|---|---|---|
| 2005/0170543 A1 | 8/2005 | Sugawara et al. | |
| 2005/0205969 A1 | 9/2005 | Ono et al. | |
| 2005/0224886 A1* | 10/2005 | Doyle et al. | 257/368 |
| 2005/0233533 A1* | 10/2005 | Alshareef et al. | 438/308 |
| 2006/0131636 A1* | 6/2006 | Jeon et al. | 257/315 |
| 2007/0059874 A1 | 3/2007 | Moumen et al. | |
| 2007/0161258 A1 | 7/2007 | Nam et al. | |
| 2008/0050898 A1 | 2/2008 | Luan | |
| 2008/0102613 A1* | 5/2008 | Elers | 438/584 |
| 2009/0053883 A1 | 2/2009 | Colombo et al. | |
| 2009/0134466 A1* | 5/2009 | Cho et al. | 257/368 |
| 2009/0191675 A1* | 7/2009 | Mehrad et al. | 438/218 |
| 2009/0309227 A1* | 12/2009 | King et al. | 257/762 |
| 2010/0065914 A1* | 3/2010 | Lin | 257/369 |
| 2010/0230756 A1* | 9/2010 | Thean et al. | 257/350 |
| 2012/0038056 A1 | 2/2012 | Cabral, Jr. et al. | |
| 2012/0086085 A1* | 4/2012 | Hsu et al. | 257/369 |
| 2012/0214286 A1 | 8/2012 | Lin et al. | |
| 2012/0223387 A1* | 9/2012 | Cui et al. | 257/366 |
| 2012/0280277 A1* | 11/2012 | Scheiper et al. | 257/190 |
| 2012/0292715 A1* | 11/2012 | Hong et al. | 257/392 |
| 2012/0309181 A1* | 12/2012 | Machkaoutsan et al. | 438/585 |
| 2013/0248952 A1* | 9/2013 | Rosenbaum et al. | 257/288 |

\* cited by examiner

METHOD FOR TUNING THE EFFECTIVE WORK FUNCTION OF A GATE STRUCTURE IN A SEMICONDUCTOR DEVICE

CROSS REFERENCE TO RELATED APPLICATIONS

Pursuant to the provisions of 35 U.S.C. §119(b), this application claims priority to EP 12199806.6 filed on Dec. 31, 2012 and EP 13151958.9 filed on Jan. 18, 2013, the entire contents of which are incorporated herein by reference.

FIELD

The present disclosure relates to a method for tuning the effective work function of a gate structure in a transistor device, the transistor device being part of an integrated circuit, the gate structure comprising a metal layer and a high-k dielectric layer separating the metal layer from an active layer of the transistor device.

BACKGROUND

In the framework of a High-K/Metal Gate MOSFET technology, it is well known that a high-k gate dielectric has higher interface charges and fixed charges with respect to a standard $SiO_2$ dielectric. This provides a detrimental effect on the threshold voltage ($V_t$) of the device, as well as on its mobility, and has a negative impact on the reliability of the device. To achieve low $V_t$ process, an appropriate metal gate electrode can be selected and/or appropriate capping layers and/or gate implant processes can be used in the state of the art. Using appropriate capping layers and/or appropriate gate implant processes is based on physical or chemical approaches, and aims at a reduction of the oxygen vacancies or creation of additional dipoles.

There exists a need for alternative and improved methods for tuning the effective work function of a High-k/Metal gate transistor device.

SUMMARY

A method for tuning the effective work function of a gate structure in a semiconductor device (as for instance a transistor or capacitor device) is described. The semiconductor device is part of an integrated circuit. The gate structure has a metal layer and a high-k dielectric layer. The high-k dielectric layer typically separates the metal layer from an active layer of the semiconductor device. The method includes providing an interconnect structure of the integrated circuit on top of the gate structure, the interconnect structure comprising a layer stack comprising at least a pre-metal dielectric layer comprising a metal filled connecting via connected to the gate structure through the pre-metal dielectric layer, and the interconnect structure having an upper exposed metal portion; and, thereafter, exposing at least part of the upper exposed metal portion to a plasma (called tuning plasma) under predetermined exposure conditions, to tune the effective work function of the gate structure.

It has been found that by exposing at least part of the upper exposed metal portion, the traps in the bulk of the high-k dielectric material can be intentionally filled, optionally in combination with other state of the art methods.

It is an advantage that the method according to aspects of the present disclosure can be combined with other standard state of the art methods, resulting in an overall improvement of the $V_t$ tuning and control thereof. Such state of the art methods include for instance:

capping layer deposition above or below the high-K dielectric (e.g., $La_2O_3$ for an NMOS device, $Al_2O_3$ for a PMOS device); and/or ion implant directly after the metal gate deposition (e.g., an As ion implant); and/or choosing an appropriate metal gate material and deposition process.

The plasma causes an antenna-driven electron motion that charges and/or alters the nature of the fixed traps of the high-K dielectric of the gate structure (without performing a real doping process). The physical mechanisms behind the process are driven by electrostatics and, therefore, it is strongly believed that it involves only the movement of electrons. It is believed that, possibly, the final high-K atoms lattice configuration may even be changed by a finally induced dipole field, which may cause atoms to rearrange as an indirect consequence, resulting in an improvement of the $V_t$ control.

It is an advantage that a transistor production process typically already includes a plasma treatment step, as for instance a metal etching plasma step, which can be predetermined or tuned, in order to further provide a predetermined $V_t$ value.

Various embodiments of the disclosure are referring to parameters of the semiconductor device such as threshold voltage ($V_t$), effective work function ($WF_{eff}$), or physical characteristics of the material(s) employed such as work function (WF), Fermi level etc. The definitions as used through this document are summarized herein below.

In the MOSFET device, the gate structure requires a threshold voltage ($V_t$) to render the channel conductive. Complementary MOS (CMOS) processes fabricate both n-channel and p-channel (respectively NMOS and PMOS) transistors. The threshold voltage $V_t$ is influenced by what is called the effective work function difference ($\Delta WF_{eff}$). To establish threshold voltage ($V_t$) values, the effective work function differences of the respective PMOS and NMOS gate materials (gate stacks) and their corresponding channel regions are independently established through gate processing and channel processing. In other words, both gate dielectric (consisting, i.e., of a host dielectric and possible different capping layers) and gate electrode (consisting, i.e., of at least one metal layer) determine the effective work function of the gate stack (device) ($WF_{eff}$). Moreover, the gate processing itself (i.e., the sequence of the different processes and/or the thermal treatments applied) may have an influence on the effective work function of the gate stack (device) ($WF_{eff}$).

The effective work function of a gate stack (device) ($WF_{eff}$) is a parameter that can be tuned (adjusted/modified) by the choice of the gate dielectric materials, gate electrode materials and by the gate processing performed. On the contrary, the work function (WF) of the gate electrode (often referred to as metal gate electrode or metal layer or metal control electrode) is an intrinsic property of the material. In general, the work function of a certain material (i.e., a metal layer) is a measure of the energy, in electron volts (eV), required to eject an electron in the material outside of a material atom to the vacuum, if the electron were initially at the Fermi level. The work function of the gate electrode may also be referred to as as-deposited work function or the intrinsic work function of the material.

For a silicon substrate, the gate electrode of a negative channel MOSFET (or NMOS) device would have an n-type work function of approximately 4.1 eV (+/−0.3 eV), and the gate electrode of a positive channel MOSFET (or PMOS) device would have a p-type work function of approximately 5.2 eV (+/−0.3 eV).

A high-k dielectric is a dielectric featuring a dielectric constant (k) higher than the dielectric constant of $SiO_2$, i.e., k>3.9. High-k dielectrics allow for a larger physical thickness (compared to $SiO_2$) for obtaining a same effective capacitance than can be obtained with a much thinner $SiO_2$ layer. The high-k dielectric typically comprises $HfO_2$, HfSi Oxide, HfSiN, $ZrO_2$, or a doped Hf Metal Oxide, $TaO_x$, $Al_2O_y$, or any combination made thereof, but can be any other state of the art high-k material known to be suitable to the skilled person.

The metal of the metal gate can be any state of the art material known to the skilled person. More generally, any known material system for wafer and semiconductor device is expected to be tunable by methods according to aspects of the present disclosure.

According to certain embodiments of the present disclosure, the high-k dielectric layer is further separated from the active layer of the transistor device by means of a silicon oxide comprising or silicon oxide layer.

The tuning plasma can for instance comprise a pressure between 1 and 100 mTorr. The tuning plasma can, for instance, have a Bias RF Power in the range of 1 to 5000 W. The exposure to the plasma can have a duration of, for instance, 1 to 1000 sec. It can comprise a gas as, for instance, $N_2$, Ar, $CF_4$, $Cl_2$, $BCl_3$, He, or O. Before the tuning plasma is applied, a pretreatment can be applied as, for instance, an exposure to He, $NH_3$, and so on. The above parameter ranges are examples and indicative values only. Larger and smaller values of these parameters are not necessarily excluded.

According to preferred embodiments of the present disclosure, the method further comprises providing a tuning layer on the upper exposed metal portion, and exposing the part of the upper exposed metal portion to the plasma through the tuning layer. The tuning layer may, for instance, comprise a photoresist or a hard mask layer (such as amorphous carbon, $SiO_2$, SiON).

The metal used in the interconnect structure can, for instance, be or comprise copper or aluminium.

According to preferred embodiments of the present disclosure, exposing at least a part of the upper exposed metal portion to a plasma under predetermined exposure conditions, to tune the effective work function of the gate structure, is performed before the interconnect structure is further electrically connected to the substrate, except for the connection to the gate structure.

According to preferred embodiments of the present disclosure, exposing at least a part of the upper exposed metal portion to a plasma to tune the effective work function of the gate structure is performed in a region located substantially above the gate structure.

According to preferred embodiments of the present disclosure, the plasma is adapted for generating and guiding charges from the interconnect structure through the gate structure towards the high-k dielectric layer of the gate structure.

According to preferred embodiments of the present disclosure, exposing to the plasma comprises irradiating directly by an ion beam.

According to preferred embodiments of the present disclosure, the method further comprises exposing at least a second part of the upper exposed metal portion to an etching plasma in order to etch part of the upper exposed metal portion. The first part and the second part can be different, i.e., disjoint parts. The etching plasma and the tuning plasma can be different plasmas.

According to preferred embodiments of the present disclosure, the plasma used for tuning the effective work function of the gate structure (tuning plasma) and the etching plasma are the same. In other words, a single plasma is used, being adapted for being used for etching the second part of the upper exposed metal portion of the interconnect structure and for exposing the first part of the upper exposed metal portion to a plasma to tune the effective work function of the gate structure.

According to preferred embodiments of the present disclosure, the upper exposed metal portion corresponds to at least a part of an upper surface of the metal filled connecting via.

According to preferred embodiments of the present disclosure, providing the interconnect structure further comprises providing a first patterned metal interconnect layer on the pre-metal dielectric layer, and exposing at least a part of the upper exposed metal portion comprises exposing at least a part of the first patterned interconnect layer.

According to preferred embodiments of the present disclosure, providing the interconnect structure further comprises providing at least one iteration of a combination of a respective patterned interconnect layer and a respective interconnect dielectric layer comprising at least one respective metal filled connecting via, and exposing at least a part of the upper exposed metal portion comprises exposing at least a part of an upper surface of the respective metal filled connecting via.

According to preferred embodiments of the present disclosure, providing the interconnect structure further comprises providing a first patterned metal interconnect layer on the pre-metal dielectric layer and providing at least one iteration of a combination of a respective interconnect dielectric layer comprising at least one respective metal filled connecting via, and a respective patterned interconnect layer, wherein exposing at least a part of the upper exposed metal portion comprises exposing at least a part of an upper patterned interconnect layer.

According to a second aspect of the present disclosure, a method for performing a combined tuning of the effective work function of a gate structure of a semiconductor device of a first type and a semiconductor of a second type is disclosed, comprising: (a) performing any of the methods according to any of embodiments of the first aspect, for the semiconductor device of the first type; and (b) performing any of the methods according to any of the embodiments of the first aspect, for the semiconductor device of the second type, wherein both exposures of respective parts of the respective upper exposed metal portions, to respective plasmas to tune the effective work functions of the respective gate structures are performed independently.

According to a third aspect of the present disclosure, a method for performing a combined tuning of the effective work function of a gate structure of a semiconductor device of a first conductivity type and a semiconductor device of a second conductivity type, comprising: (a) performing any of the methods according to any of the embodiments of the first aspect, for the semiconductor device of the first conductivity type; and (b) performing any of the methods according to any of the embodiments of the first aspect, for the semiconductor device of the second conductivity type, wherein a single plasma is used and is adapted together with one or two respective tuning layers, to tune, during contemporary exposure of respective parts of the exposed metal portions, the effective work function of the gate structure of the first conductivity type and the effective work function of the gate structure of the second conductivity type.

According to preferred embodiments, the method comprises providing a tuning layer on the upper exposed metal portion, and exposing the part of the upper exposed metal portion to the plasma through the tuning layer, for the semiconductor device of the first conductivity type, and does not comprise providing a tuning layer on the upper exposed metal portion, and exposing the part of the upper exposed metal portion to the plasma through the tuning layer, for the semiconductor device of the second conductivity type.

As used in the description of the second and third aspect of the present disclosure, a semiconductor device, for instance, a transistor or capacitor, of a first type can be a PMOS transistor or a NMOS transistor. The transistor of the second type can then respectively be a NMOS or PMOS transistor. The first conduction type can, thus, be different than (and more specifically opposite to) the second conduction type. Alternatively, the semiconductor device of the first type can be a semiconductor device having a first conductivity, while the semiconductor device of the second type can have a second conductivity different from the first conductivity. Both devices can be of the same type, i.e., they can both be NMOS or PMOS.

BRIEF DESCRIPTION OF THE DRAWINGS

The disclosure will be further elucidated by means of the following description and the appended figures.

FIGS. 7 and 8 illustrate the efficiency of the $V_t$ shift. FIGS. 9 to 11 illustrate that methods according to aspects of the present disclosure can be performed without detrimentally impacting the rest of the device, and that the methods according to aspects of the present disclosure are reliable.

DETAILED DESCRIPTION

Figure 1:
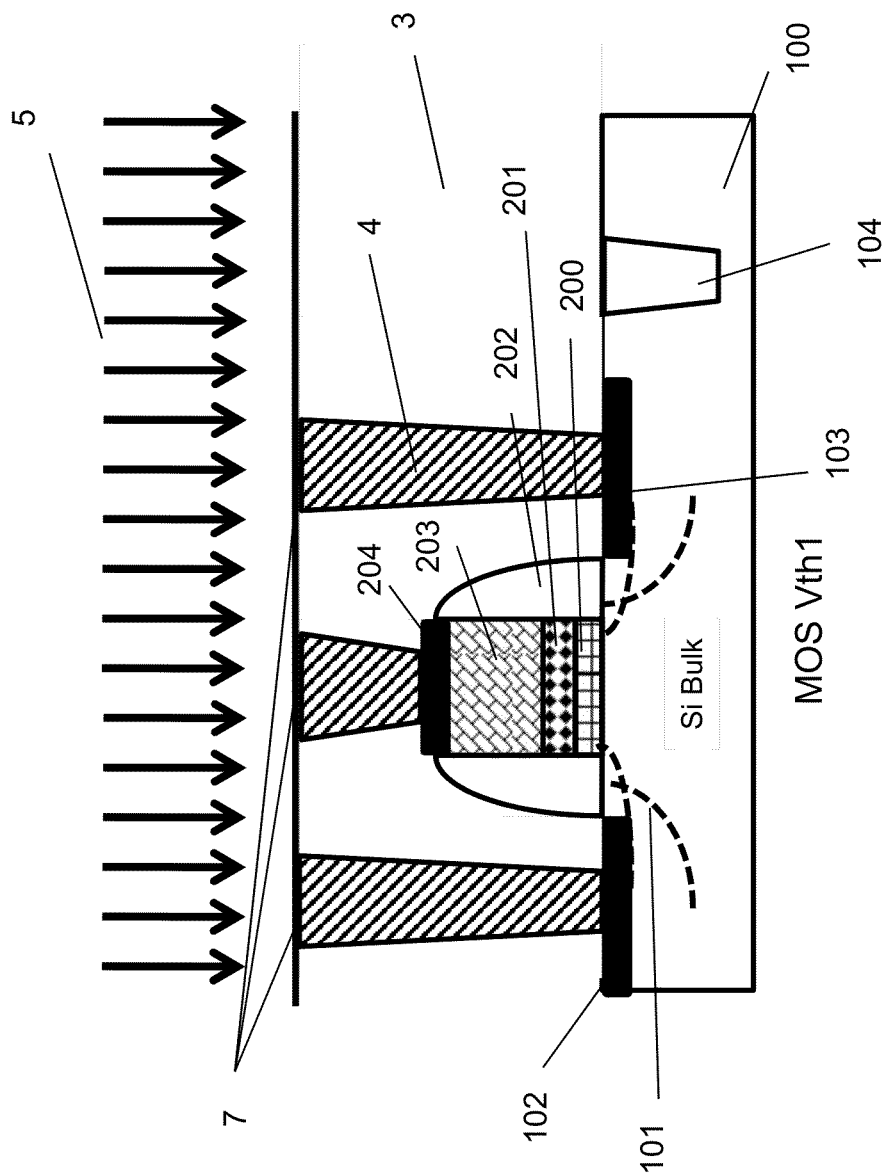
FIGS. 1 to 6 illustrate different embodiments of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising" used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIGS. 1 to 6 illustrate alternative embodiments of the present disclosure.

FIG. 1 illustrates a first embodiment according to aspects of the present disclosure. On silicon bulk wafer or substrate, which could alternatively be any state of the art semiconductor wafer or substrate, a semiconductor device is provided as for instance a transistor (used further in the description) or capacitor device. In embodiments, the "substrate" may include a semiconductor substrate such as a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass and silicon-on-sapphire substrates. The term "substrate" is thus used to define generally the elements for layers that underlie a layer or portions of interest. Also, the "substrate" may be any other base on which a layer is formed, for example a glass or metal layer.

Accordingly, a substrate may be a wafer such as a blanket wafer or may be a layer applied to another base material, e.g., an epitaxial layer grown onto a lower layer.

In FIG. 1, the substrate 100 is for instance provided with shallow trench isolation (STI) structures 104, which are electrically isolating adjacent transistors, and typically comprise trenches in the substrate filled with a dielectric material, as for instance a Silicon Oxide. Source and drain junctions 101, and source and drain contacts 102 and 103, are provided according to state of the art methods.

A gate structure is provided comprising a metal layer 203 and a high-k dielectric layer 201 separating the metal layer 203 (metal gate) from an active layer (e.g., channel layer or region) of the semiconductor device. An interfacial oxide 200 can be present in between the active layer and the high-k dielectric layer 202, typically delimited by spacers 202. Typically, a silicide layer 204 is provided on top of the metal gate 203. A pre-metal dielectric 3 is provided. Contacts 4 (comprising source, drain and gate contacts) are provided as metal filled vias through the pre-metal dielectric 3, and abut onto the front surface of the substratem forming an upper exposed metal portion 7. By exposing at least a part (first part) of an upper exposed portion 7 of the interconnect structure, in this case the upper surface of the through contacts embodied by the metal filled vias, to an appropriate plasma 5, the $V_t$ of the transistor device can be tuned or trimmed.

The plasma treatment 5 causes an antenna-driven electron motion that charges the fixed traps of the high-K dielectric of the gate structure (without performing a real doping process). The physical mechanisms behind the process are driven by electrostatics, and therefore it involves only the movement of electrons. It is believed that, possibly, the final high-K atoms lattice configuration may even be changed by a finally induced dipole field, which may cause atoms to rearrange as an indirect consequence, resulting in an improvement of the $V_t$ control.

Figure 2:
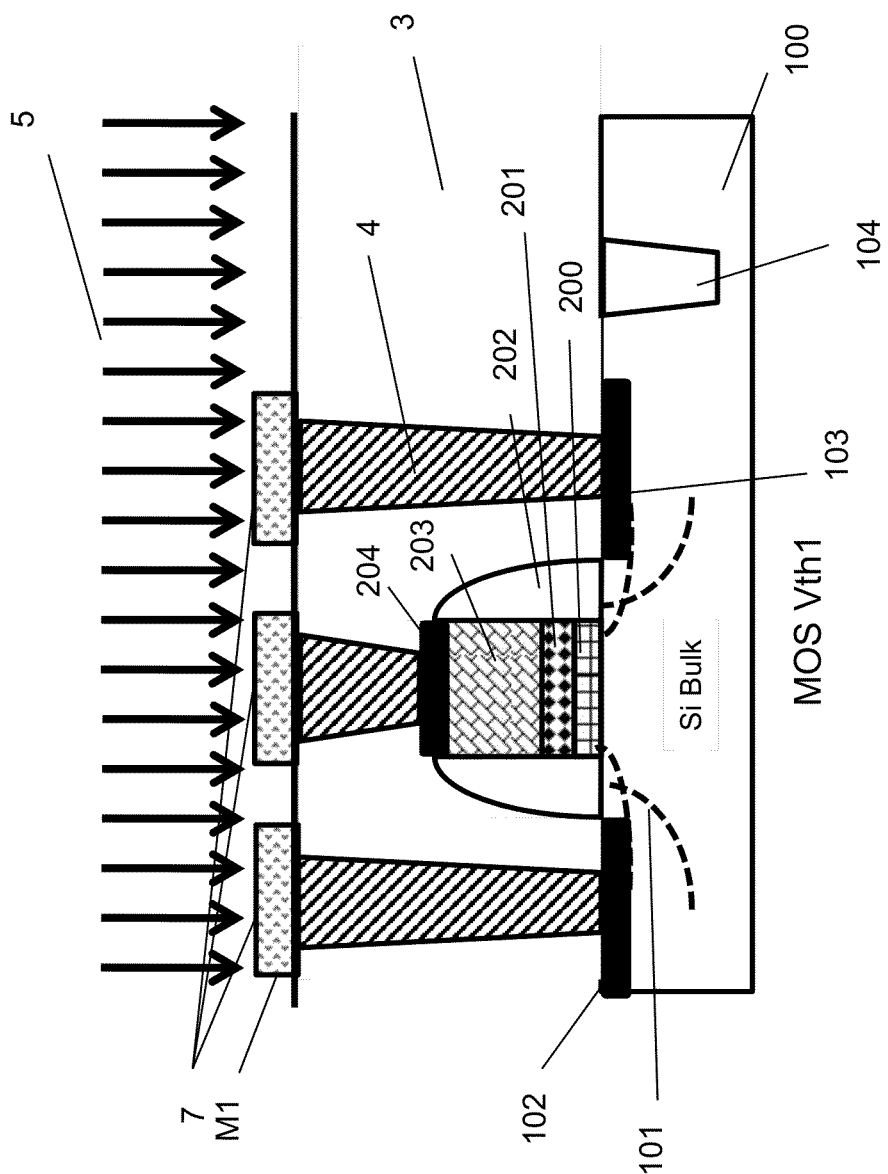

FIG. 2 illustrates a further embodiment of the present disclosure, which is similar to the embodiment described in relation with FIG. 1, but where the exposure to the plasma occurs later in the fabrication process of the semiconductor device. It further comprises providing a first metal interconnect layer (in the art often called "Metal 1" or M1 layer), which is patterned, and which embodies the upper exposed metal layer portion 7 of the interconnect structure. At least a part of the upper exposed metal portion 7 is exposed to a plasma under predetermined exposure conditions, to tune the effective work function of the gate structure.

Figure 3:
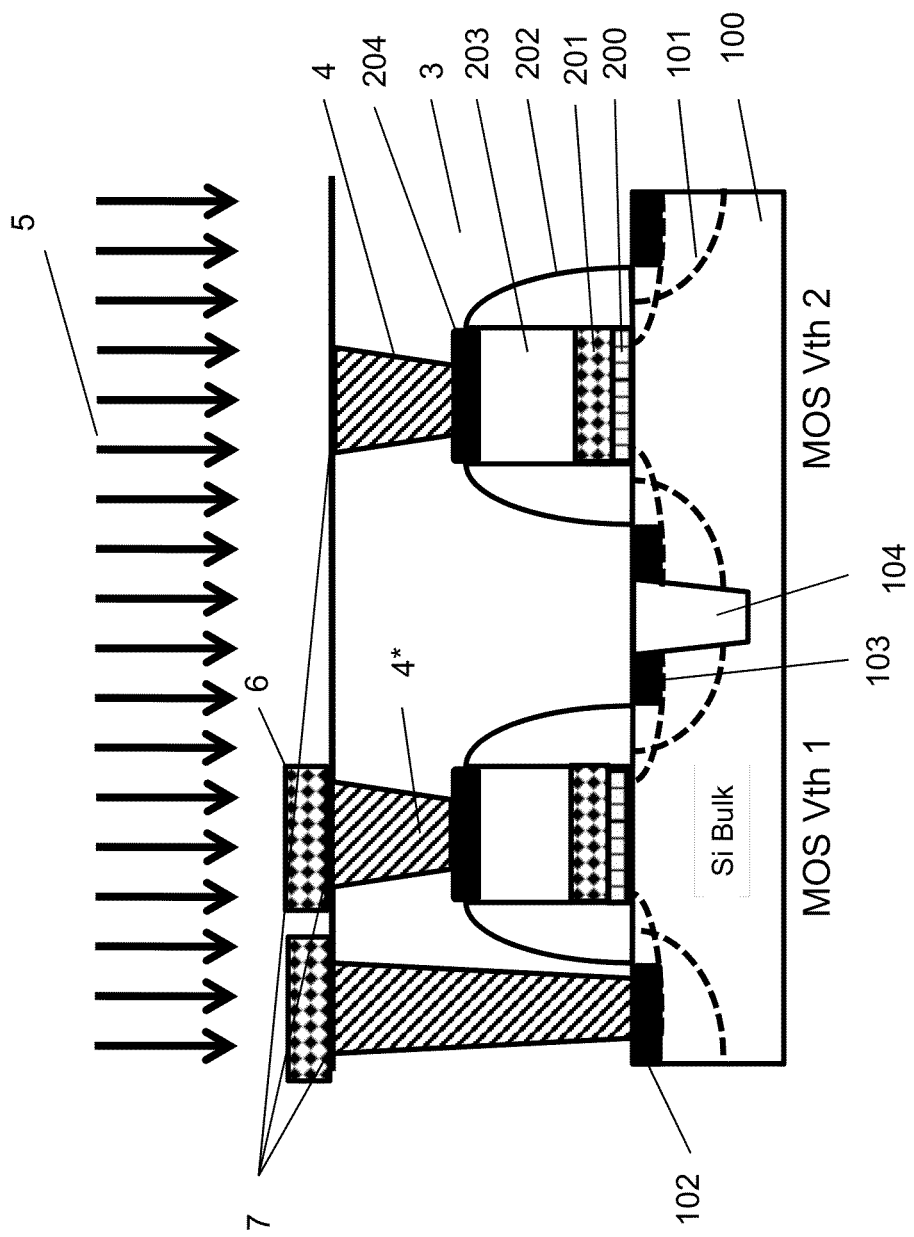

FIG. 3 illustrates a further embodiment of aspects of the present disclosure. Two identical transistor structures are provided on the same substrate 100. A metal filled via in the pre-metal dielectric layer corresponds to the gate contact 4 towards the gate of the first transistor structure. Another metal filled via in the pre-metal dielectric layer corresponds to the gate contact 4* towards the gate of the second transistor structure. Only one of the contacts is covered with a tuning layer, which is suitable for modulating the effect of the plasma over the different contacts 4 and 4*.

For instance, by providing a tuning layer on the front surface or exposed surface of only one of the contacts 4 or 4*, and not on the other one, a different effect can be achieved with a single plasma on the different transistors (e.g., an NMOS and a PMOS transistor). As a limit case, by having a relatively thick tuning layer 6 (e.g., larger than 10 nm), the effect of the plasma can be annihilated or limited on one of the contacts, while it can have its full effect on the other of the two contacts. In this case, the tuning layer can also be seen as a protection layer.

Alternatively, the presence of a tuning layer can also cause the plasma effect to occur, and the contact not being covered by the tuning layer may, for instance, not experience any effect of an applied plasma. In still alternative embodiments, different tuning layer 6 can be applied on different contacts or transistor structures, in order to provide different effects on different transistor structures for a single plasma. The thickness of the tuning layer is preferably of the same order as the thickness of the gate dielectric (comprising high-k layer and optionally interfacial oxide), and is preferably between 1 and 2 nm to achieve optimal tuning In still other embodiments, different tuning layers 6 can be applied to different transistor devices/respective gate contacts, and independent plasma treatments can be applied to the different transistor devices/respective gate contacts. This can for instance be achieved by using state of the art shielding techniques that remove or reduce interference of the different exposures in respective non-concerned areas.

Figure 4:
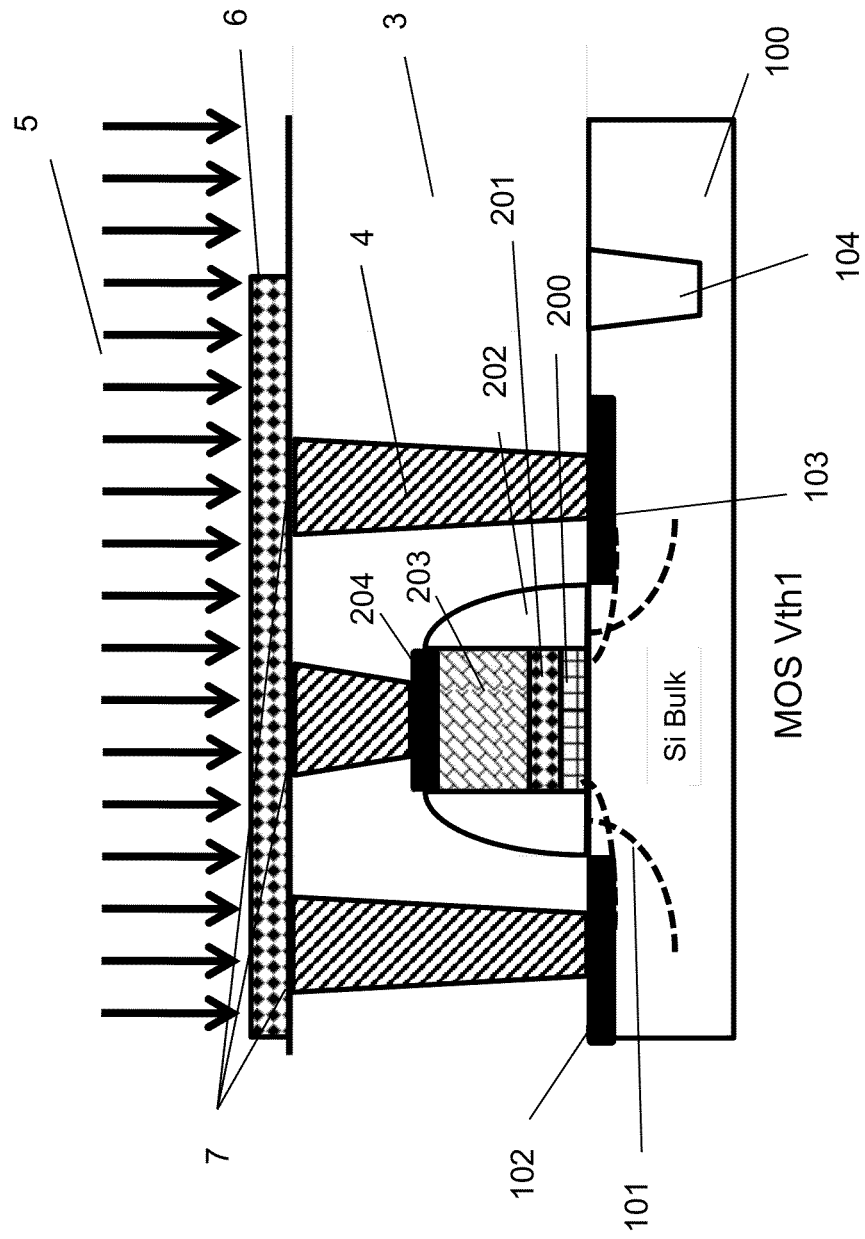

FIG. 4 illustrates a further embodiment of the present disclosure, wherein a tuning layer 6 is applied as a continuous film covering the source and drain contacts of one transistor.

Figure 5:
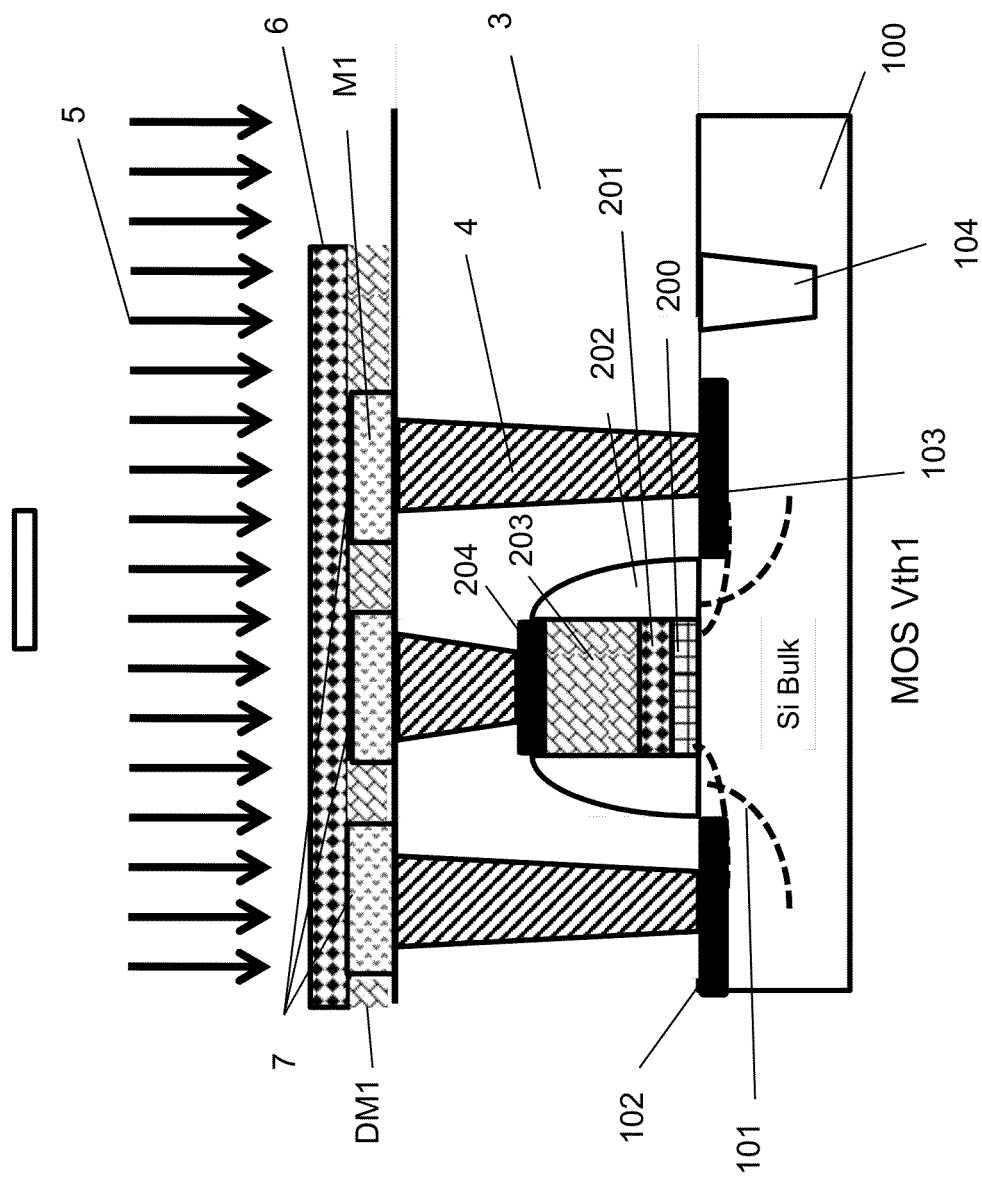

FIG. 5 illustrates a further embodiment of the present disclosure, similar to the embodiment described in relation with FIG. 4, and based on the embodiments described in relation with FIG. 2. Here, portion of the metal 1 (M1) interconnect layer, which further comprises an M1 interconnect dielectric layer DM1 as this is known in the art, are covered with a tuning layer 6. Here, the tuning layer is applied as a continuous film covering also the source and drain contacts of one transistor.

Figure 6:
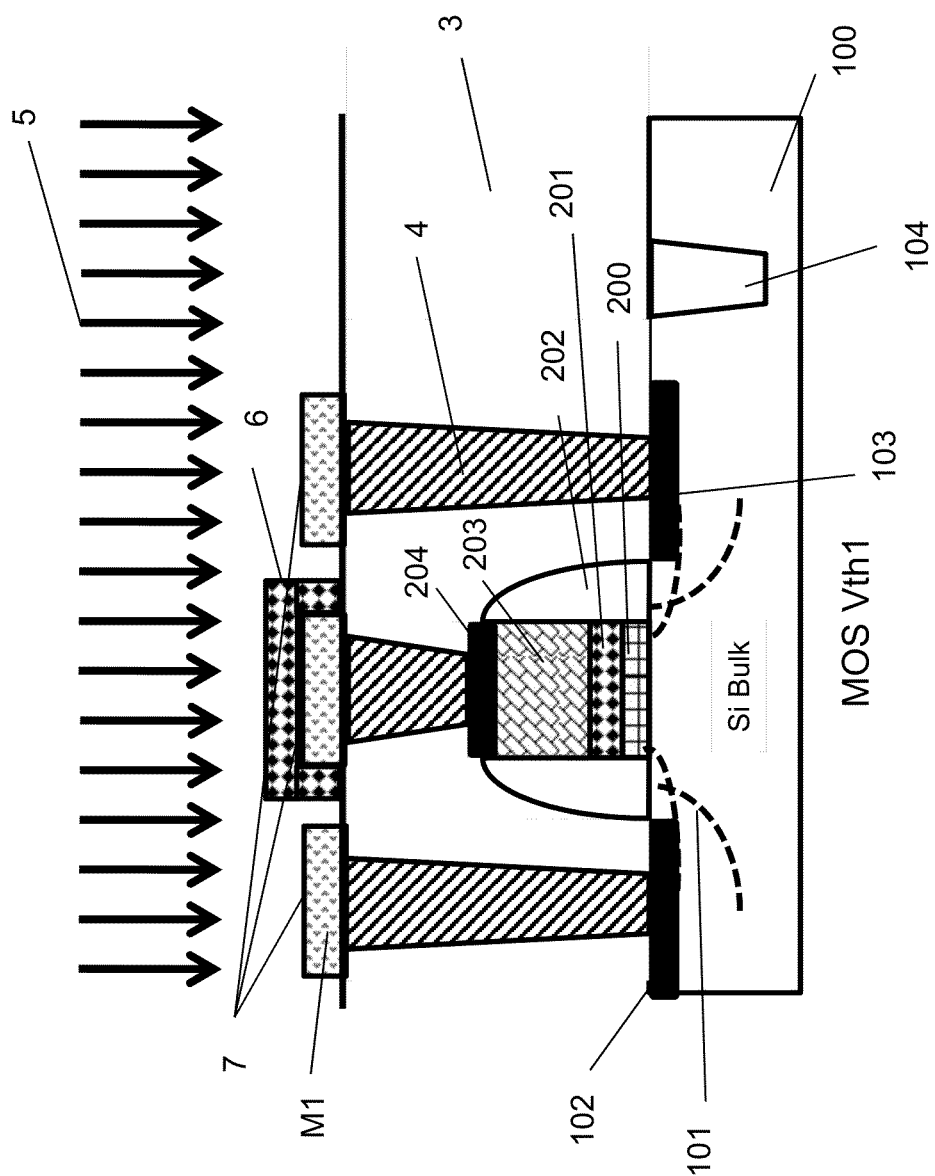

FIG. 6 illustrates a still further embodiment of the present disclosure, based on the embodiments described in relation with FIG. 2. Here, the tuning layer 6 is selectively applied on the M1 layer, in the area above the gate contact 4. This can, for instance, be performed by depositing and patterning a continuous tuning layer.

Figure 7:
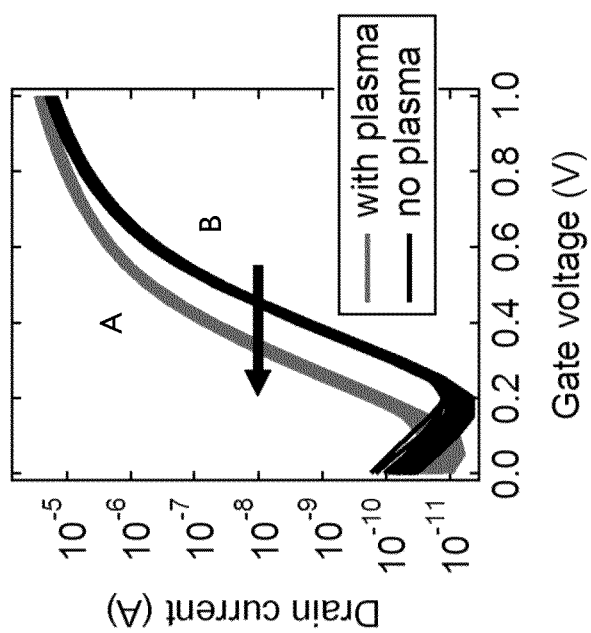
FIGS. 7 to 11 show electrical results supporting aspects of the present disclosure.
Figure 8B:
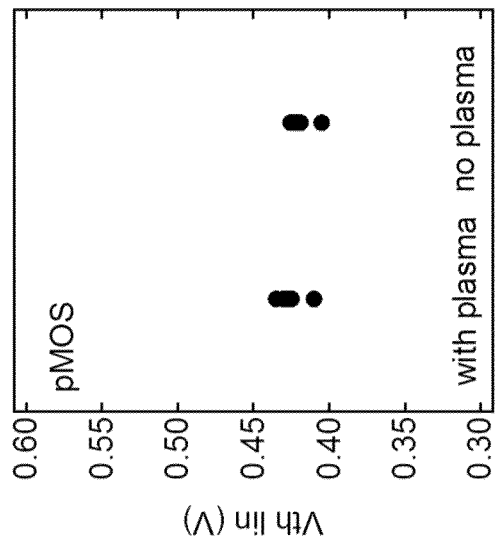
Figure 8A:
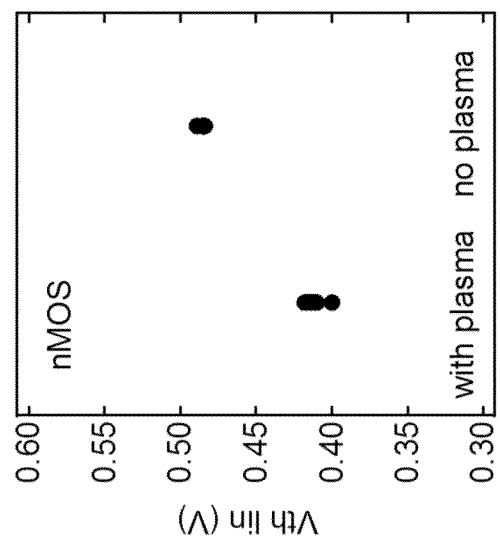
Figure 9:
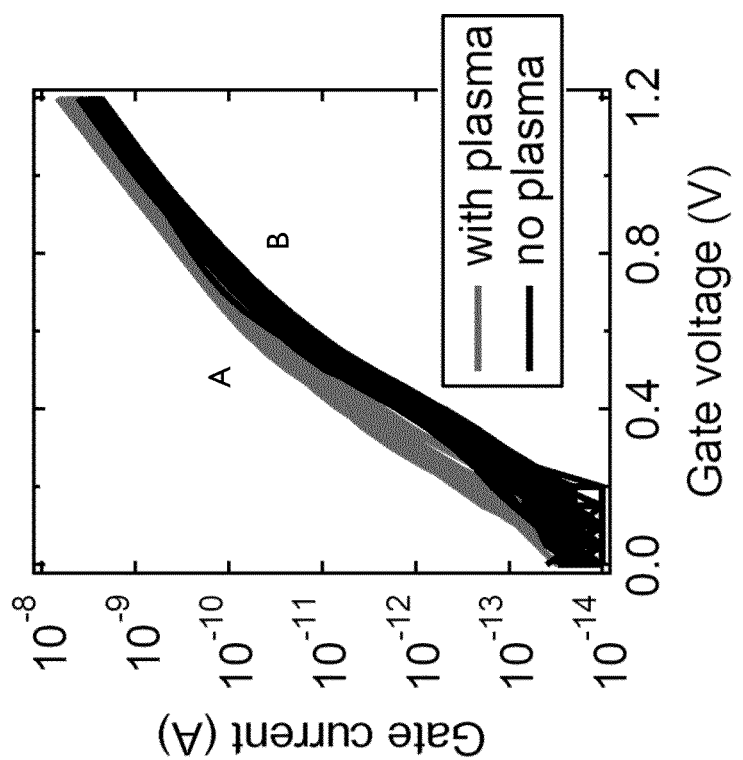
Figure 10:
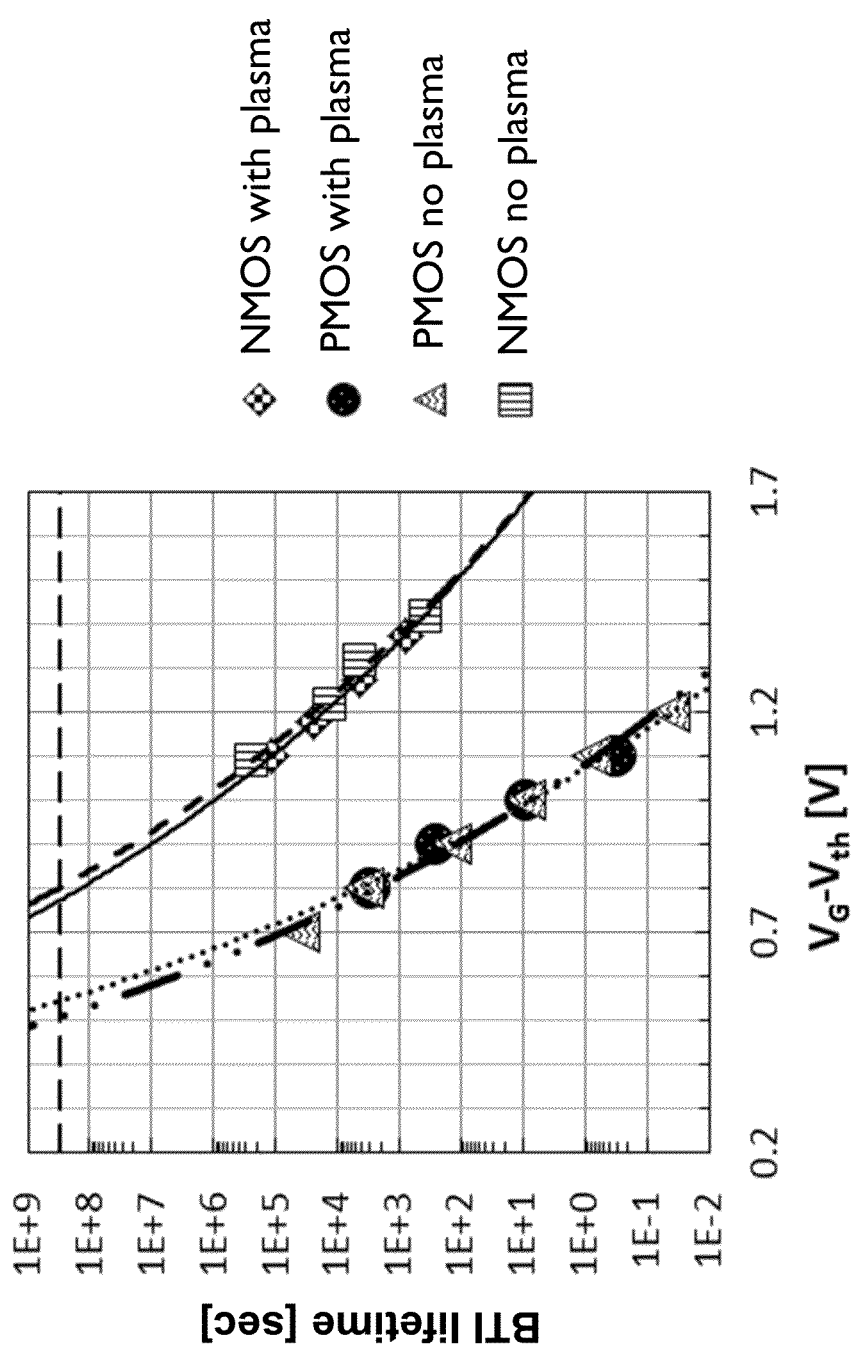
Figure 11:
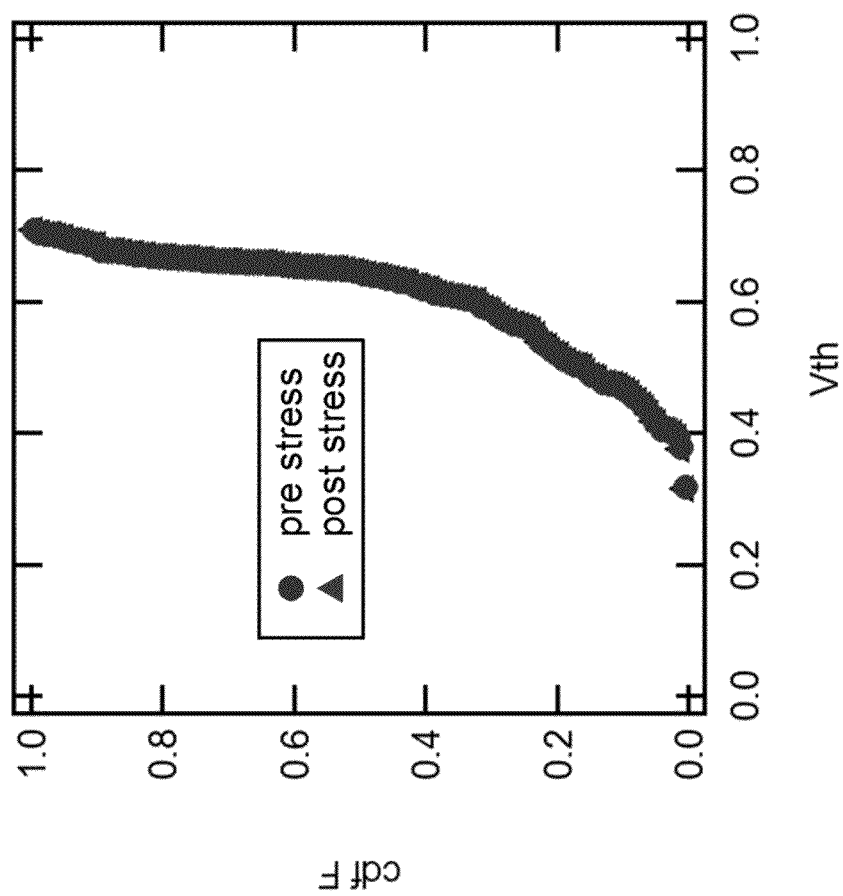

FIGS. 7 to 11 show electrical results supporting aspects of the present disclosure. FIGS. 7 and 8a and 8b illustrate the efficiency of the $V_t$ shift. FIGS. 9 to 11 illustrate that methods according to aspects of the present disclosure can be performed without detrimentally impacting the rest of the device, and that the methods according to aspects of the present disclosure are reliable. The electrical results are based on the following material system:
 a silicon substrate;
 a gate stack comprising a $SiO_2$ interfacial oxide layer;
 a high-k dielectric layer, being a $HfO_2$ (Hafnium oxide) layer;
 TiN (Titanium nitride) metal electrode;
 a tuning layer being a photoresist layer;
 a via metal in the pre-metal dielectric layer ("via 0") comprising W (Tungsten); and
 a Cu (Copper) metal interconnect layer for the first metal interconnect level ("metal 1").

It will be appreciated that the skilled person would be able to identify similar or other material systems that provide the same effects and advantages.

FIG. 7 shows results which prove the plasma effect on high-k metal gate N-MOSFET devices by comparing experimental data on devices exposed or not exposed to the plasma step.

In the example of FIG. 7, a comparison is performed on two test structures exposed to the same plasma step and located on the same wafer. One test structure comprises a protection diode connected to the gate, which is diverting the plasma induced current to the substrate and, thus, prevents any effect (black traces, B). The other test structure is without protection diode (grey traces, A). The graph shows a series of MOSFET transfer characteristics (Id/Vg curves). From this illustration, the plasma is shown to affect only the threshold voltage (Vth) of devices (lateral shift of curves) without significantly impacting the other device characteristics such as sub threshold slope, mobility, or saturation current. The device geometry is as follows: a channel width=1 μm, a channel length=1 μm.

In FIG. 8a, the effectiveness of the plasma step is further experimentally proven through the systematic comparison of Vth of protected (right) and non-protected (left) N-MOSFET devices across a wafer: The Vth of non-protected devices are reduced by approximately 100 mV as compared to the reference devices with protection diode.

In FIG. 8b, it is also demonstrated that the plasma is capable to be specific to the device type and, e.g., impacting only N-type devices without impacting P-type devices, as in the example above. The figure illustrates Vth of PFETs with (right) or without (left) protection diode, taken from the same plasma-exposed CMOS wafer as in FIG. 8a. This clearly shows that the two PMOS devices are undistinguishable, which demonstrates that the same plasma can have a selective effect on the NMOS and not on the PMOS.

In FIG. 9, a comparison of leakage current through the gate dielectric stack (Ig/Vg) curves above) for the same N-type devices as in FIG. 7 with (black traces, B, lower portion of the graph) or without (grey traces, A, upper portion of the graph) protection diode is made. This shows that the plasma has no detrimental impact on the gate leakage. The difference between the two groups of curves is mainly due to the different Vth, not to an activation of additional degradation mechanisms into the gate stack.

Conventional Bias Temperature Instability (BTI) reliability tests performed on plasma-exposed N (squares) and P-type (triangle, circles) devices with or without protection diode (similar to FIGS. 8a and 8b) demonstrate that the plasma step has no detrimental impact on BTI on both N-type (Vth affected by plasma) and P-type (Vth not affected by plasma) devices. This is illustrated in FIG. 10. Besides, conventional dielectric breakdown tests (TDDB, not illustrated here) and extraction of interface states density (not shown here) showed no significant difference between exposed or non-exposed devices (N or P-type), further proving that the plasma step does not induce any reliability issue.

Further, in FIG. 11, the charging of the fixed traps in the high-k, which is the mechanisms responsible for the plasma induced Vth shift, is demonstrated to be stable through a reversed-bias voltage stress test performed on plasma exposed N-Type devices similar to FIG. 8 (without protection diode). No drift is observed in the Vth distribution, as illustrated by the two overlapping cumulative curves corresponding to pre-(trace of dots) and post-(trace of triangles) voltage stress Vth measured on a large amount of N-MOSFET devices.

The invention claimed is:

1. A method for tuning the effective work function of a gate structure in a semiconductor device, the semiconductor device being part of an integrated circuit, the gate structure comprising a metal layer and a high-k dielectric layer separating the metal layer from an active layer of the semiconductor device, the method comprising:
    providing an interconnect structure of the integrated circuit on top of the gate structure, the interconnect structure comprising a layer stack with at least a pre-metal dielectric layer having a metal filled connecting via connected to the gate structure through the pre-metal dielectric layer, and the interconnect structure having an upper exposed metal portion; and
    thereafter, exposing at least part of the upper exposed metal portion to a plasma under predetermined exposure conditions, to tune the effective work function of the gate structure.

2. The method according to claim 1, further comprising providing a tuning layer on the upper exposed metal portion, and exposing the part of the upper exposed metal portion to the plasma through the tuning layer.

3. The method according to claim 1, wherein exposing at least part of the upper exposed metal portion to a plasma is performed before the interconnect structure is further electrically connected to a substrate of the semiconductor device.

4. The method according to claim 1, wherein exposing at least part of the upper exposed metal portion to a plasma is performed in a region located substantially above the gate structure.

5. The method according to claim 1, wherein the plasma is adapted for generating and guiding charges from the interconnect structure through the gate structure towards the high-k dielectric layer of the gate structure.

6. The method according to claim 1, wherein exposing at least part of the upper exposed metal portion to the plasma comprises irradiating directly by an ion beam.

7. The method according to claim 1, further comprising exposing at least a second part of the upper exposed metal portion to an etching plasma in order to etch the second part of the upper exposed metal portion.

8. The method according to claim 7, wherein the plasma for tuning and the etching plasma are the same.

9. The method according to claim 1, wherein the upper exposed metal portion corresponds to at least a portion of an upper surface of the metal filled connecting via.

10. The method according to claim 1, wherein providing the interconnect structure further comprises providing a first patterned metal interconnect layer on the pre-metal dielectric layer, and wherein exposing at least part of the upper exposed metal portion comprises exposing at least part of the first patterned metal interconnect layer.

11. The method according to claim 1, wherein providing the interconnect structure further comprises providing at least one iteration of a combination of a respective patterned interconnect layer and a respective interconnect dielectric layer comprising at least one respective metal filled connecting via, and wherein exposing at least part of the upper exposed metal portion comprises exposing at least part of an upper surface of the respective metal filled connecting via.

12. The method according to claim 1, wherein providing the interconnect structure further comprises providing a first patterned metal interconnect layer on the pre-metal dielectric layer and providing at least one iteration of a combination of a respective interconnect dielectric layer comprising at least one respective metal filled connecting via, and a respective patterned interconnect layer, wherein exposing at least part of the upper exposed metal portion comprises exposing at least part of an upper patterned interconnect layer.

13. A method for tuning a first effective work function of a first gate structure in a first semiconductor device of a first type and tuning a second effective work function of a second gate structure in a second semiconductor device of a second type, the first and second semiconductor devices being part of an integrated circuit, the first and second gate structures comprising a metal layer and a high-k dielectric layer separating the metal layer from an active layer of the semiconductor devices, the method comprising:
    providing a first interconnect structure of the integrated circuit on top of the first gate structure, the first interconnect structure comprising a first layer stack with at least a first pre-metal dielectric layer having a first metal filled connecting via connected to the first gate structure through the first pre-metal dielectric layer, and the first interconnect structure having a first upper exposed metal portion;
    providing a second interconnect structure of the integrated circuit on top of the second gate structure, the second interconnect structure comprising a second layer stack with at least a second pre-metal dielectric layer having a second metal filled connecting via connected to the second gate structure through the second pre-metal dielectric layer, and the second interconnect structure having a second upper exposed metal portion; and
    thereafter, exposing at least part of the first and second upper exposed metal portions to a plasma under predetermined exposure conditions, to tune the first and second effective work functions of the first and second gate structures, wherein exposing at least part of the first upper exposed metal portion to a plasma is performed independently from exposing at least part of the second upper exposed metal portion to a plasma.

14. A method for tuning a first effective work function of a first gate structure in a first semiconductor device of a first type and tuning a second effective work function of a second gate structure in a second semiconductor device of a second type, the first and second semiconductor devices being part of an integrated circuit, the first and second gate structures comprising a metal layer and a high-k dielectric layer separating the metal layer from an active layer of the semiconductor devices, the method comprising:
    providing a first interconnect structure of the integrated circuit on top of the first gate structure, the first interconnect structure comprising a first layer stack with at least a first pre-metal dielectric layer having a first metal filled connecting via connected to the first gate structure through the first pre-metal dielectric layer, and the first interconnect structure having a first upper exposed metal portion;

providing a second interconnect structure of the integrated circuit on top of the second gate structure, the second interconnect structure comprising a second layer stack with at least a second pre-metal dielectric layer having a second metal filled connecting via connected to the second gate structure through the second pre-metal dielectric layer, and the second interconnect structure having a second upper exposed metal portion; and thereafter, exposing at least part of the first and second upper exposed metal portions to a plasma under predetermined exposure conditions, to tune the first and second effective work functions of the first and second gate structures, wherein exposing at least part of the first and second upper exposed metal portions is performed with a single plasma.

* * * * *